United States Patent
Kalfaian

Patent Number: 5,196,710
Date of Patent: Mar. 23, 1993

[54] METHOD AND APPARATUS OF IMPLANTING ELECTRONS IN A SOLID FOR ELECTRICAL GENERATION

[76] Inventor: Meguer V. Kalfaian, 962 Hyperion Ave., Los Angeles, Calif. 90029

[21] Appl. No.: 784,882

[22] Filed: Oct. 30, 1991

Related U.S. Application Data

[63] Continuation-in-part of Ser. No. 345,002, Apr. 28, 1989, abandoned, which is a continuation-in-part of Ser. No. 231,436, Aug. 12, 1988, abandoned, which is a continuation-in-part of Ser. No. 140,572, Jan. 14, 1988, abandoned, which is a continuation-in-part of Ser. No. 13,076, Feb. 9, 1987, abandoned, which is a continuation-in-part of Ser. No. 642,250, Aug. 20, 1984, abandoned.

[51] Int. Cl.$^5$ .............................................. H01J 37/30
[52] U.S. Cl. ........................... 250/492.1; 250/492.2; 250/492.3
[58] Field of Search ................ 250/492.1, 492.2, 492.3

[56] References Cited

FOREIGN PATENT DOCUMENTS 2208758  9/1991  United Kingdom .

Primary Examiner—Bruce C. Anderson

[57] ABSTRACT

A non-conductive solid is heated to a temperature where magnetic binds of atoms are weakened, and an external magnetic field is applied to reorient the atoms into uniformity. The heating is performed through a template, so that a marginal portion at periphery of the plate is prevented to get too hot for atomic reorientation. Thus, when the plate is cooled, and fused to the marginal portion, the central portion contains uniformalized atoms, and any changes that would naturally occur when exposed to open space is prevented by the unaltered marginal portion. Due to atomic uniformity, electrons are implanted easily from one surface to the other of the plate, and both surfaces are metalized for deriving d-c output effected by automatic precession of the electrons.

6 Claims, 2 Drawing Sheets

FIG. 1.
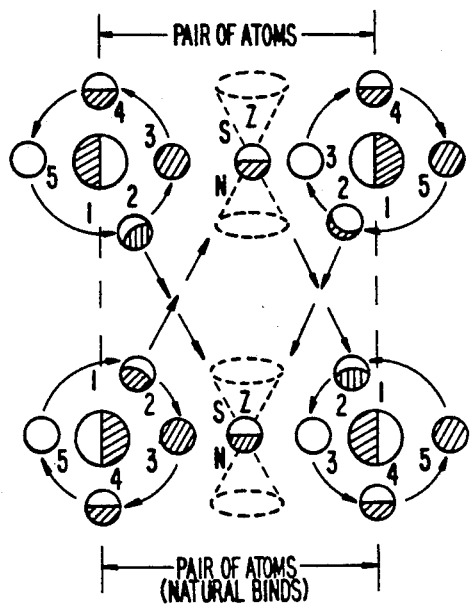
FIG. 2.
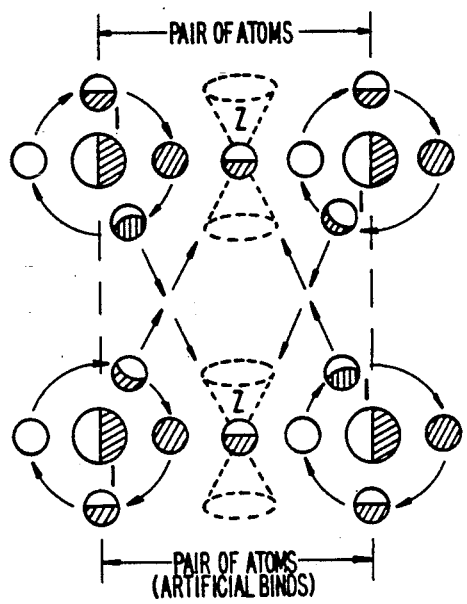
FIG. 3.
FIG. 4.
FIG. 5.
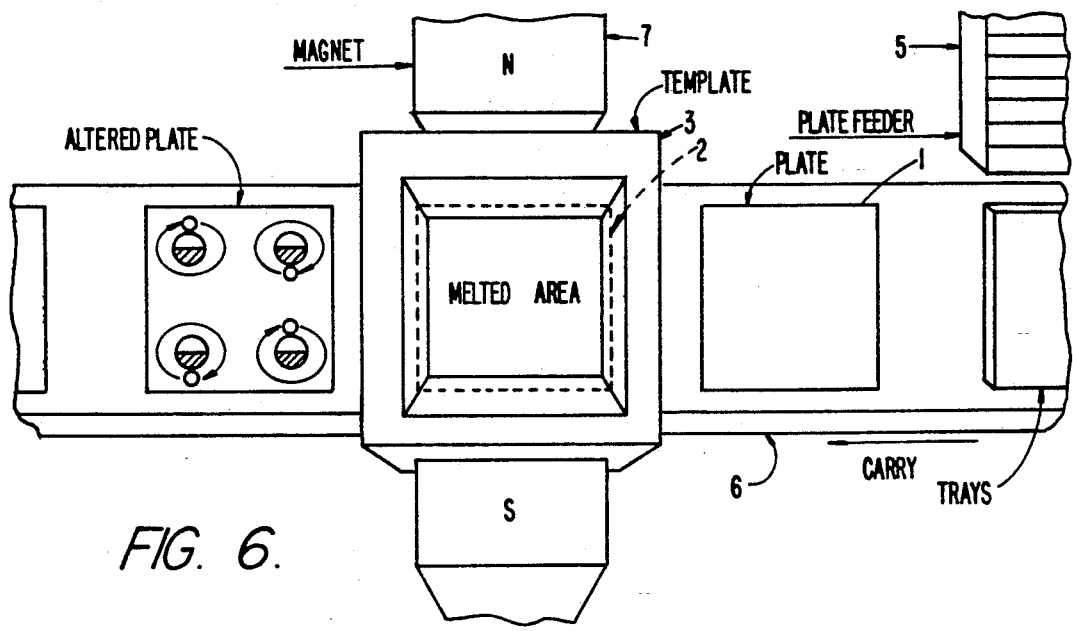
FIG. 6.

METHOD AND APPARATUS OF IMPLANTING ELECTRONS IN A SOLID FOR ELECTRICAL GENERATION

This is an continuation-in-part of the invention disclosed in my application Ser. No. 345,002 filed Apr. 28, 1989 now abandoned, which is a continuation-in-part of Ser. No. 231,436 filed Aug. 12, 1988 now abandoned, which is a continuation-in-part of Ser. No. 140,572 filed Jan. 4, 1988 now abandoned; which is a continuation-in-part of Ser. No. 013,076 filed Feb. 9, 1987 now abandoned; which is a continuation-in-part of Ser. No. 642,250 filed Aug. 20, 1984 now abandoned, but patented in Britain as 2,208,758 B issued Sep. 11, 1991.

This invention relates to self generation of electrical energy by electron precession, and more particularly to polar uniformalization of free electrons in a solid, for effecting self excitation into precessional resonance for radiation of said electrical energy. One object of the invention is to obtain a high intensity electrical output by the uniformly precessing resonance of a large number of free electrons in said solid. The present invention, however, is similar to my invention disclosed in my U.K. patent issue No. GB 2,208,758 B but it is an improvement of the method of fabrication, in order to render practicality of its utilization.

BACKGROUND

According to generally accepted assumption, it is stated that the gyrating electron, or the nucleus, will not radiate, by reference to the practiced NMR (Nuclear Magnetic Resonance) wherein, it is assumed that the angularly tilted nuclei within the cylindrical uniform magnetic field precess, but they do not radiate. Such an assumption is, of course fallaciously erroneous, because the reason that the tilted nuclei within the cylindrical magnet do not radiate is because, they tilt angularly but they are not free to gyrate. The mere fact that an electron (or nucleus) is tilted angularly by an applied magnetic field does not mean that it will precess—it is against the laws and rules of physics. Precession of a spinning body can be obtained only by a specific manner of field application, which allows freedom of the body to gyrate. That is, the plane of the magnetic torque should be perpendicular to the axis of the spinning electron (or nucleus), in order to equalize the angular exertion of the torque throughout a complete gyration. I have described this in detail in my above mentioned patent issue, and it is not necessary to repeat herein. In short, accordingly, energy radiation is effected by polar motion of spin motion of the electron. And since spin motion of the electron is perpetual by nature, all that is to be done is, to cause precession of the electron by a non expendable static magnetic force, in order to obtain electrical output without applying expendable energy.

DIFFICULTIES OF EFFECTING POLAR UNIFORMITY OF ELECTRONS

In my patent issue, as mentioned in the foregoing, I had proposed to use a thin non-conducting wafer, both surfaces of which are implanted with free electrons, axially perpendicular to said surfaces. When one surface of this wafer is placed on the flat pole face of a magnet, the free electrons will tilt and precess. This precession will generate an electromagnetic field in a direction perpendicular to the electron axis, and a direct voltage at its polar tips. Thus, when both surfaces of this wafer are metalized, a direct voltage (or current) can be obtained. Due to random configurative orientations of atoms in a natural solid, however, it is difficult to obtain polar uniformity of implanted electrons, as described in the following:

PRACTICE OF ELECTRON IMPLANTATION IN SOLIDS

According to general practice, electron penetration is limited to 5 microns deep from the surface of the solid without causing damage to the material. This represents about 3000 layers of implanted electrons. According to natural physionomy of solids, the first few layers of electrons will be axially perpendicular to the plane of the surface, and the rest randomly polarized. This is the reason why deep electron implantation cannot be used in my reference disclosure, with waste of space and energy. But the fact that electron implantation is limited to 5 microns deep, is the reason that the atoms are randomly arrayed in the solid, and while the arriving flow of electrons are uniformly polarized, they cannot easily travel the zig-zag electrical paths in the solid. Whereas, if it were possible to first uniformalize the configurative orientations of atoms in the solid, then the arriving electrons would penetrate from one flat surface to the other of the solid with ease, and with polar uniformity.

CHANGING CONFIGURATIVE ORIENTATIONS OF ATOMS IN SOLIDS

Referring to an example of a naturally formed solid, assume that the upper pair of atoms in FIG. 1 are at the surface of a solid, and the lower pair is at lower layer from the surface. In natural formation of a solid, the nuclei of a pair of atoms are always oppositely polarized and they are bound to each other by the magnetic fields between their outer orbiting electrons. In order to keep the magnetic force between the nucleus and the orbiting electron constant, the orbiting electron must twist 360 degrees during a complete orbit, as indicated by the shadings of the electrons (N-shaded, S-blank) in five different orbital positions. The binding of the pair of atoms is achieved at position 3, where the two electrons are oppositely polarized for maximum magnetic attraction, as shown. Further in natural rules of forming a solid, the orbiting electrons of a pair of atoms choose the shortest distance in traveling toward each other at point 3, which is starting from point 1, as shown. But if we could change the orientations of these two pairs of atoms artificially, such as shown in FIG. 2, the pairs of atoms can still bind each other without disintegration, for example, the magnetic attraction of the orbiting electrons between the pair of atoms at positions 1 would still cause them to travel toward each other to position 3. In this case, it will be seen that the nuclei are all uniformly polarized. Further, if we implant electrons z in this artificially altered atomic arrangement, these free electrons will all be uniformly polarized, as shown.

AUTOMATIC PRECESSIONAL RESONANCE OF THE FREE ELECTRONS

Referring again to FIG. 2, assume that the lower pair of atoms are immediately below the upper pair. Now referring to the travel motions of the orbiting electrons, and starting from position 1, the orbiting electron of the upper left hand atom has no magnetic effect upon the electron z of the lower pair. But the orbiting electron of the upper right hand atom projects a magnetic field upon the electron z of the lower pair and tilts it angularly. During the rest of orbital travel, the tilted electron starts resolving to its original polar orientation, in the form of gyration. When the orbiting electron of upper left hand atom makes 180 degree travel, it projects another magnetic field to the electron z of the lower pair of atoms, and this automatic precessional function continues between the upper and lower pairs of atoms.

PRECESSIONAL WAVEFORM OF THE ELECTRON Z

When the electron z is free to resolve at the orbiting frequency, the precessional waveform will be, as shown in FIG. 3. When the atomic arrangement of the solid is such that the free electron z has resonance at a lower frequency, then the precessional waveform will be, as shown in FIG. 4, and at further lower frequency, the waveform will be as shown in FIG. 5. All these waveforms, however, will produce a d-c output at the surfaces of the solid.

SUPERCONDUCTING PHENONENON

In superconducting phenomenon, it is important to unerstand the functions of heat and cold radiations. For example, referring to an available thermoelectric unit, the surface of a ceramic plate is implanted with free electrons, which are randomly polarized due to structure of the solid, as described in the foregoing. When electric current is passed through the electrons in one direction, the electrons gyrate in a direction along the spin rotations. These gyrating electrons radiate electromagnetic fields, and by mutual induction, the magnetic components of radiation tilt each other's polar orientations. The stress of these magnetic torques creates a resistive component, and produces heat.

When the applied electric current is reversed, the plate becomes cold. This means that the electrons are now gyrating in a direction against their spin rotations, and which means that when the electrons are forced to gyrate in a direction against their spin rotations, it radiates cold wave. And further it means that, the magnetic component of radiation is cancelled out.

Following the above given information on heat and cold radiation, and referring again to the present day superconductors, they are made with powders containing ample amount of free electrons, but they are unnaturally random in their polar orientations. Thus, those free electrons that would precess by pulsed projections from orbiting electrons of neighboring atoms are prevented to gyrate, for reasons, as described above. Whereas, when the superconductor is subjected to cold temperature, the magnetic component of field radiation is cancelled out, and all of the free electrons, regardless of their polar orientations, gyrate freely without affecting each other's polar orientations. Of course, a d-c output cannot be obtained, because of their random polar orientations.

UNIFORMALIZING ATOMIC CONFIGURATIONS IN A SOLID

In any attempt of causing artificial changes in a solid, we must first understand the natural rules of forming a solid. The very basic is that the configurative orientations of the atoms at the surface is always different than at the inner layer. For example, when a solid is broken into half, the two halves will no longer adhere to each other, even with perfect juxtapositioning. The reason is that, the atomic configurations at the two surfaces change instantly. In its basic rule, accordingly, the nuclei of atoms at the surface are axially parallel to the plane of the surface, and these axes change in the inner layers. In such a state, if we implant free electrons on the flat surface of a solid, they will be uniformly polarized, axially perpendicular to the surface plane of the solid. The problem is then to create this uniformity throughout a solid plate.

In solid form, the magnetic binds between atoms are very strong, and difficult to change magnetically. But when the solid is melted, their magnetic binds are weakened, and can be oriented, desired, between the poles of strong magnets. Theoretically, when the melted solid is cooled while the magnets are in on positions, the atomic uniformity will remain unchanged. But as described in the foregoing, the atomic configurations around the flat plate will naturally change, even with the magnet being on. In such a state, when free electrons are implanted in the solid, the randomly polarized electrons at the peripheral surfaces of the plate will short out the precessional radiations of the uniformly polarized electrons and stop precession. Such an undesired condition can be circumvented, however, by fusing the melted plate to a surrounding non-conductive ring, so that when the melted plate is cooled, it does not have an open surface at its peripheral region, and therefore, it cannot undergo any structurally defined atomic changes.

EXAMPLE

Assume that the plate 1 in FIG. 6 is non-conductive. The region 2 at the boundary within the dotted line is prevented from getting red hot by a heat resisting template 3, and the inner portion of the dotted line is melted by conventional means. The upper and lower ends of the plate 1 is placed between the pole faces of two oppositely poled magnets, but they are not shown in the drawing. In melted state, the atomic binds are weakened, and they are oriented uniformly, as shown by the nuclei of two pairs of atoms (shaded portion indicating north pole, and the blank portions indicating south pole). The temperature of the solid region 2 is controlled, so that the configurative orientations of the atoms are not completely uniformalized, but this region is hot enough to fuse with the inner portion, when it is cooled. That is, the melted portion is hot enough to melt the inner edge sufficiently, so that when the inner melted portion cools with the magnets being in on position, both portions will fuse with each other. In effect, the inner controlled portion does not have an outer surface, and therefore, no changes can occur after cooling period, and the uniform orientation of the atoms remain fixed in its solid form. In order to be completely sure that this atomic uniformalization is without fault, electron implantation can be performed only within the portion of dot-and-dash lines, as a suggestion. Of course, the plate 1 can be in any shape, as desired.

In view of these detailed informations regarding the true function of superconductivity, a brief of the invention is, as follows:

BRIEF EMBODIMENT OF THE INVENTION

Electron implantation from surface to surface of a flat non-conductive plate with polar uniformity is achieved by first uniformalizing the configurative orientations of atoms in the plate, so that the implanted electrons find free electrical paths to penetrate from one surface to the other with polar uniformity. This is achieved by placing a non-conductive plate between the pole faces of strong magnets, so that the field radiation crosses the boundary of the flat plate in a straight line. A heat rsisting template is placed on the plate, so that the template covers a predetermined region at the peripheral boundary of the plate. When the inner portion of this region of the plate is melted by conventional means, the atomic binds are weakened and oriented uniformly in a direction of the applied field. The region covered by the template, however is not melted, so that when the melted portion is cooled, it is fused with the non-melted region. Since now the outer periphery of the melted and cooled portion is fused to the non-melted portion, the outer periphery of the melted and cooled portion does not have an open space, and cannot undergo atomic changes, which would otherwise occur if said outer periphery were in open space, as by natural law. This treated plate is then implanted with free electrons by conventional means, which will provide uniformly polarized electrons in desired density. The two surfaces of this plate are then metalized, as output terminals, for deriving a d-c output therefrom.

BRIEF DESCRIPTION OF THE DRAWINGS

FIG. 1 shows atomic structure of naturally formed solid.

FIG. 2 shows how the atomic configurative orientations can be changed artificially into uniform orientations without destroying the solid.

FIGS. 3, 4 and 5 show the output waveforms by automatic precessional resonances of free electrons, when they are implanted artificially in the altered structure of the solid in FIG. 2.

FIG. 6 shows mechanism for altering atomic orientations of a non-conductive plate by heating and cooling within a magnetic field, and a heat resisting template.

BEST MODE OF CARRYING OUT THE INVENTION

Figure 8:
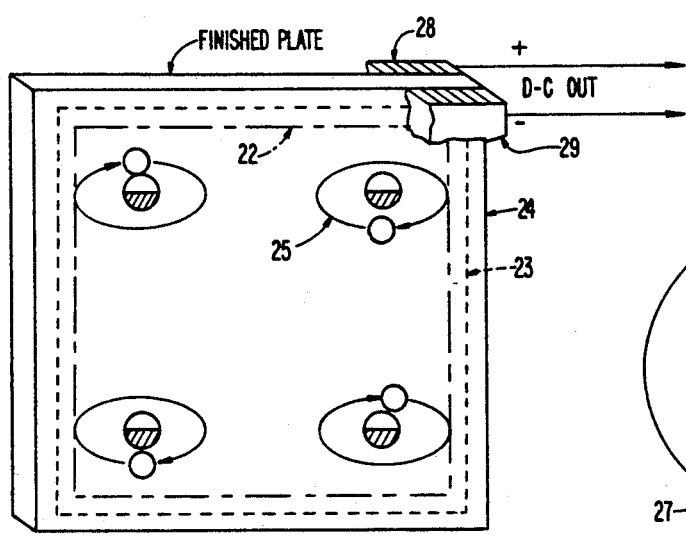
FIG. 8 shows how the non-conductive plate is altered artificially.
Figure 9:
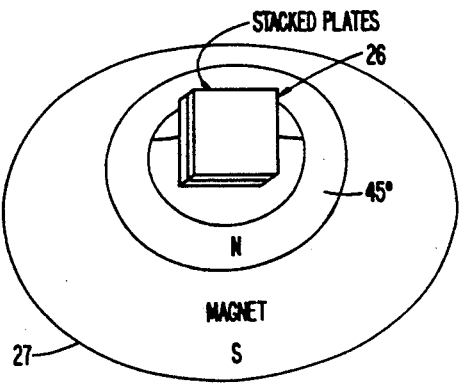
FIG. 9 shows how several finished plates can be assembled in series connections, as an example, and a supplemental magnet can be used to help increase the magnitude of precessional resonance of the gyrating electrons.

In view of the informations provided in the foregoing, the first step is to effect artificial alteration of atomic configurations in a non-conductive material. This plate, or wafer, may be in different shapes, for example, a square plate, as shown in FIG. 8. A heat resisting template is shaped with a flat bottom, and a central square shaped opening to fit the dotted square line in the region 2 of the plate 1. Now referring to the drawing of FIG. 6, a plurality of these plates 1 are stored in container 5, which by a conventional apparatus of feeding mechanism, feeds the plates 1 to the carrier belt 6, in the spaced trays, as shown. Thus, assume that the carrier belt 6 has moved one of these plates 1 under the template 3, so that the flat bottom portion of the template 3 rests on the region 2 of the plate 1. The north and south pole faces of a strong magnet 7 are placed across the belt 6, so that their magnetic field lines cross along opposite boundaries of the plate 1, as illustrated. Now in such a condition, the central square portion of the plate 1 is heated through the central opening of the template 3, to a point that the magnetic binds of atoms in the plate are weakened, and reoriented into uniform polarization, as shown in FIG. 2. As described in the foregoing, the region 2 at the boundary of the plate 1 is prevented from being melted by the template, so that atomic alteration cannot occur in this region. Thus, when the melted portion of the plate cools, the two portions of the plate fuse to each other, and the atomic uniformity remains unchanged in its solid form, as indicated in plate 1 at the left hand side of the drawing.

Figure 7:
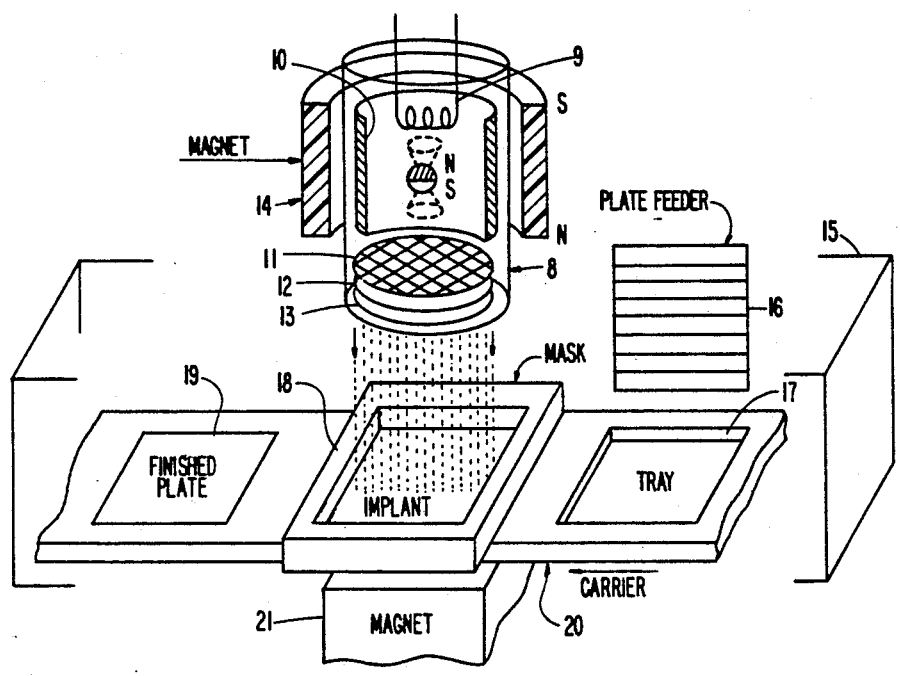
FIG. 7 shows conventional mechanism for electron implantation in the plate of FIG. 8.

This artificially altered solid plate is now ready to be implanted with free electrons in a conventionally practiced electron implanting apparatus, as shown in FIG. 7. This apparatus consists of a cylindrical vacuum chamber 8, comprising a filament 9 for emitting electrons; a cylindrical anode 10 for drawing away the electrons emitted from the filament; an electron extractor electrode 11 for extracting the released electrons downwards for implantation, through the grid electrode 12 and ground electrode 13. Externally of the cylindrical chamber 8, there is mounted a cylindrical magnet 14, for repelling the emitted electrons from touching the anode electrode 10, so as to prevent electron draw, and thereby allowing the emitted electrons to fill up the said chamber.

In operation, when the filament 9 is lighted, and a positive voltage is applied to the anode 10, the emitted electrons are drawn to the positive anode 9, and in their travel motions they become magnetic. Thus, before they touch the anode for current draw, they are compressed toward the center by the magnetic field of the cylindrical maget 14. In such a condition, the electrons are forced by two dimensional fields, the first rendering them magnetic, and the second forcing them into precessional gyration. Thus, instead of the emitted electrons being drawn to the anode 10, they fill up the chamber 8 in a precessional state, which is at light frequency, according to the high voltage applied to the anode 9, and therefore, they glow at a reddish light, called glow, or plasma. The normal voltages applied to the electrodes 11 (extractor); grid 12; and ground 13 prevent the stored electrons in the chamber 8 from flowing downwards to the high voltage electrode under the substrate that the electrons are to be implanted in, but due to the particular dimension of the drawing, this high voltage electrode is not shown, and it is cognizant to the skilled in the art.

In continuing the operation of the system, the rest of the vacuum chamber 8 (within the enclosure 15, shown only by few lines) contains a storage mechanism for blank non-conductive plates, represented only by horizontal lines 16. In operation, accordingly, the storage bin 16 drops a blank plate in the tray 17 of the carrier 20, which moves the plate underneath the mask 18, then the voltage to the extractor 11 is switched to excitation level, so that the stored electrons in the chamber 8 are drawn downwards by the high voltage attraction of the electrode underneath the plate, not shown. The velocity of electron travel depends upon the voltage applied to this electrode, not shown. In general practice, this voltage is about 200K volts, which will allow electron implantation about 5 microns deep from the surface. In the present case, however, the electrons can easily travel through the material due to the atomic uniformity, and therefore, the plate can be 0.2 cm thick for surface to surface implantation, without affecting the electron uniformity of implantation. Of course, a magnet 21 may also be used, to ensure that all of the implanted electrons are uniformly polarized. Thus, when the electron implantation is ended, the plate is moved to the left side of the mask 18, in the form of finished plate 19, as shown. As a suggestion, however, the size of the central opening of the mask 18 in FIG. 7 can be the same as the inner square 22, instead of the region 23 of the plate 24 in FIG. 8, to ensure that the atoms are completely uniformalized, as shown.

Both surfaces of the plate 24 in FIG. 8 are metalized as output terminals 28, and 29 for deriving d-c output, as shown. But in reference to the process of electron implantation, it might be better to metalize one surface of the plate (the surface opposite to the direction from which the implanting electrons arrive in FIG. 7), so that the velocity of the implanting electrons can be adjusted high enough to penetrate the metalization, also, so as to ensure complete penetration of the plate by electrons.

In reference to the drawings of FIGS. 3 to 5, it will be observed that the waveform of self operating precessional resonance of the implanted electron is not a complete gyration, and therefore, power output is less than it actually should be. This output can be increased, however, by adding a static magnet 27, the pole face of which is arranged to tilt the implanted electrons from 45 degree angle as indicated in the drawing. In this arrangement, numerous plates are connected in series, respective of each other.

Having described the preferred embodiment of the invention, it will be apparent to the skilled in the art that various modifications may be made, for example, the template 3 in FIG. 5 can be eliminated, because natural changes of atomic configurations at the peripheral edge occurs only within a marginal portion of the plate, and this portion is already avoided from implantation by the mask 18 of FIG. 7. Also modifications can be made, for example, one surface of the plate can be left open for field radiation purposes. Similarly, parts mentioned may be substituted, without departing from the true spirit and scope of the invention, as claimed.

What I claim is:

1. The method of artificially uniformalizing the configurative orientations of atoms in a non-conductive plate having two oppositely spaced flat surfaces, whereby rendering said plate receptive to electron implantation freely from one surface to the other without resistance, and with polar unity axially perpendicular to the planes of said surfaces, comprising the steps of:

heating and shaping a substantially non-conductive substance into the shape of said plate, and said heat having been adjusted to render said substance sensitive to weakening the magnetic binds of its atoms for magnetic control;

masking the heat at a marginal portion at the peripheral edge of said heated substance to a temperature that the magnetic binds of atoms are not affected for magnetic control;

applying a magnetic field to said heated substance from a direction parallel to the planes of said surfaces for said magnetic control, whereby retaining said uniformity of atoms when said heat is removed; and and implanting electrons on said plate to at least one of said surfaces, axially perpendicular thereto by virtue of said directional magnetic control.

2. The plate as set forth in claim 1, wherein is included the step of metalizing both surfaces of the plate in the form of electrodes.

3. The method of artificially uniformalizing the configurative orientations of atoms in a non-conductive plate having two oppositely spaced flat surfaces, whereby rendering said plate receptive to electron implantation freely from one surface to the other without resistance, and with polar unity axially perpendicular to the planes of said surfaces, comprising the steps of:

heating and shaping a substantially non-conductive substance into the shape of said plate, and said heat having been adjusted to render said substance sensitive to weakening the magnetic binds of its atoms for magnetic control;

applying a magnetic field to said heated substance from a direction parallel to the planes of said surfaces for said magnetic control, whereby retaining said uniformity of atoms when said heat is removed; and implanting electrons on said plate from one of said surfaces within a central area of the surface marginally smaller than the peripheral edge of the surface where natural randomness of the configurative orientations of atoms occurs, said electrons being axially perpendicular to the planes of said surfaces by virtue of said direction of field application.

4. The plate as set forth in claim 3, wherein is included the step of metalizing both surfaces of said plate in the form of electrodes.

5. Apparatus for artificially uniformalizing the configurative orientations of atoms in a non-conductive plate having two oppositely spaced flat surfaces, whereby rendering said plate receptive to electron implantation freely from one surface to the other without resistance, and with polar unity axially perpendicular to the planes of said surfaces, comprising:

a non-conductive substance;

a heat radiating means for heating and shaping said substance into a solid plate having two oppositely parallel flat surfaces, said heat radiating means having been adjusted to a degree of heat where the atomic magnetic binds are weakened for magnetic control;

magnetic control means, and means for applying its field to the said plate for uniformalizing the configurative orientations of said weakened atoms from a direction parallel to said surface planes, whereby retaining said atomic uniformity after said heat radiating is removed;

electron implanting means, and means therefore for implanting electrons in said plate from one of said surfaces; and a mask in said electron implanting means, covering a marginal edge at the periphery of said plate to avoid electron implantation, where randomness of atomic configurative orientations occur naturally.

6. The apparatus as set forth in claim 5, wherein is included means for metalizing both surfaces of said plate, in the form of electrodes.

* * * * *